United States Patent [19]

Craft et al.

[11] Patent Number: 5,418,974

[45] Date of Patent: May 23, 1995

[54] CIRCUIT DESIGN METHOD AND SYSTEM THEREFOR

[75] Inventors: Barry G. Craft, Fishkill, N.Y.; Rocco A. Crea, Westwood, N.J.; Richard D. Kimmel, Wappingers Falls, N.Y.

[73] Assignee: International Business Machines Corporation, Armonk, N.Y.

[21] Appl. No.: 958,389

[22] Filed: Oct. 8, 1992

[51] Int. Cl.$^6$ .............. G06F 7/544; G06F 11/16; G06F 15/20; G06F 15/60

[52] U.S. Cl. .................. 395/800; 364/224.1; 364/224.2; 364/232.3; 364/264.3; 364/264.7; 364/267.8; 364/269.4; 364/490; 364/DIG. 1; 364/DIG. 2; 364/578; 395/500

[58] Field of Search .............. 395/800, 500, 550, 575, 395/325, 375, 775, 725, 250, 275; 364/551.01, 578, 570, DIG. 1, DIG. 2, 488, 490, 491, 560, 489

[56] References Cited

U.S. PATENT DOCUMENTS

| | | | |
|---|---|---|---|
| 3,702,011 | 10/1972 | Armstrong | 444/1 |
| 4,386,403 | 5/1983 | Hsieh | 364/300 |
| 4,527,249 | 7/1985 | VanBrunt | 364/578 |
| 4,601,032 | 7/1986 | Robinson | 371/23 |
| 4,669,083 | 5/1987 | Laviron | 371/23 |
| 4,727,545 | 2/1988 | Glackemeyer | 371/23 |
| 4,791,578 | 12/1988 | Fazio | 364/488 |
| 4,797,838 | 1/1989 | Nelson et al. | 364/551.01 |
| 4,937,765 | 6/1990 | Shupe et al. | 364/570 |
| 5,047,969 | 9/1991 | Sloane | 364/578 |
| 5,157,778 | 10/1992 | Bischoff et al. | 395/500 |
| 5,245,543 | 9/1993 | Smayling et al. | 364/468 |
| 5,301,118 | 4/1994 | Heck et al. | 364/554 |
| 5,345,401 | 9/1994 | Tani | 371/23 |

OTHER PUBLICATIONS

V. Visvanathan, "Variational Analysis of Integrated Circuits" IEEE International Conference on Computer-Aided Design. held Nov. 11-13, 1986, The IEEE Computer Society, pp. 228-231.

L. Liu, et al, "Computer-Aided Design for Quality (CADQ)" AT&T Technical Journal, vol. 69, No. 3, pp. 46-60, May/Jun. 1990.

Hadamard Analysis—An Effective, Systematic Tool For Worst Case Circuit Analysis, F. Severson and S. Simpkins.

IEEE 1987 Custom Integrated Circuits Conference, pp. 114-118, A Methodology For Worst Case Analysis of Integrated Circuits, S. R. Nassif, et al., IEEE Transactions on Computer Aided Design, vol. CAD-5, No. 1, Jan. 1986, pp. 104-113.

A. J. Stroiwas et al., "A Methodology for Worst Case Design of Integrated Circuits".

S. K. Jain, "Statistical Fault Analysis", IEEE Design & Test, Feb. 1985.

D. M. Bohling et al., "An Interactive Computer Approach to Tolerance Analysis", IEEE Transactions on Computers, vol. C19, Jan. 1970.

*Primary Examiner*—Alyssa H. Bowler
*Assistant Examiner*—Daniel H. Pan
*Attorney, Agent, or Firm*—Charles W. Peterson, Jr.; Kris V. Srikrishnan

[57] ABSTRACT

A system and method for designing a structure such as a circuit. First the sensitivity of a circuit performance function (sensitivity data set - SDS) to at least one physical parameter is determined. Then, an estimated distribution of the design function calculated by using the SDS and random parameter values. Subsequently, the parameters corresponding to the estimated distribution was used to accurately calculate the tail. The tail is compared to a predetermined design objectives. If the objectives are not met, the design is modified and the calculation steps repeated until the design objectives are met.

2 Claims, 11 Drawing Sheets

AN EXAMPLE OF AN ESTIMATED DISTRIBUTION

ESTIMATED DISTRIBUTION; E.G., 2K CASES
USER DEFINED TAIL (0.5%): = 0.005x2K=10 CASES
0.13% TAIL AREA: = 0.0013x2K = 2.6 =3 CASES

A MAGNIFIED VIEW OF TAIL REGION

"ESCAPE" FLOW DIAGRAM

FIG. 4

A COMPARISON OF ACCURACY-
ESCAPE VS MONTE CARLO

| | 200 CASES | | | | | | |
|---|---|---|---|---|---|---|---|
| | TRUE DISTB. | | ESCAPE | | | | |
| | | | ALL STAT.VAR. (99) | | | SEL.STAT.VAR. (23) | |
| | MEAN | $3\sigma$ | MEAN | $3\sigma$ | $\rho$ | MEAN $3\sigma$ | $\rho$ |
| PF1 | 357 | 77 | 353 | 76 | 0.995 | 356 75 | 0.988 |
| PF2 | 332 | 76 | 331 | 75 | 0.993 | 332 74 | 0.989 |
| PF3 | 368 | 89 | 367 | 91 | 0.994 | 368 92 | 0.989 |
| PF4 | 351 | 87 | 345 | 91 | 0.994 | 351 90 | 0.989 |
| PF5 | -17 | 42 | -22 | 41 | 0.991 | -17 39 | 0.982 |
| PF6 | -25 | 19 | -23 | 18 | 0.953 | -24 16 | 0.876 |
| PF7 | 11 | 75 | 14 | 73 | 0.994 | 12 72 | 0.970 |
| MAX. DIFF. | | | 6 | 4 | | 1 3 | |

GENERATION OF ESTIMATED DISTRIBUTION

FIG. 6A
ESCAPE INITIAL SELECTION PANEL

COMMAND ===>

SELECT OPTION ====>

1 MAIN OPTIONS PANELS
  2 SELECT STATISTICAL VARIABLE NAMES AND WRITE THEM TO A DATASET
    (THIS WILL NOT PRODUCE A STANDARD ESCAPE SIMULATION)

NAME OF AS/X INPUT DATASET ===> CSEF.DATA

ESCAPE NEWS: ENTER NEWS AT COMMAND LINE
  ENTER PROCESS     PF3 PREVIOUS PANEL     PF4 END

FIG. 6B
ESCAPE MAIN OPTIONS PANEL

COMMAND ===>    MAIN OPTIONS

SELECT OPTION ===> 5  (DEFAULT: ALL)

1 SENSITIVITIES
  2 SENSITIVITIES AND ESTIMATED HISTOGRAMS
  3 ESTIMATED HISTOGRAMS        3A WITHOUT NOMINAL VALUE
  4 ESTIMATED HISTOGRAMS AND TRUE TAILS  4A WITHOUT NOMINAL VALUE
  5 ALL
  6 REPLACE/ADD SENSITIVITIES IN SDS

FOR OPTIONS 2 THRU 5 ENTER THE FOLLOWING INFORMATION

NUMBER OF CASES FOR ESTIMATED HISTOGRAMS (DEFAULT 2K) ===> 2500
  NUMBER OF TAIL CASES  (USE () FOR AREA, D FOR DEFAULT)
  (DEFAULT: 10 CASE TAIL, NO ENTRIES: POSITIVE TAIL DEFAULT)

POSATIVE TAIL  ===> D
    NEGATIVE TAIL ===>
    ENTER PROCESS     PF3 PREVIOUS PANEL     PF4 END

FIG. 6C
ESCAPE ADDITIONAL OPTIONS PANEL

COMMAND ===>    ADDITIONAL OPTIONS

GRAPHICS OUTPUT (Y/N) ===> N

SAVE GO DATASET INFORMATION AND
USE IN ALL ESCAPE COMPUTATIONS (Y/N) ===> N

TAIL FAILURE CRITERIA ===> 3   (DEFAULT 3 SIGMA)
  FOR SIGMA POINT ENTER 3 TO 4.5
  FOR NUMBER OF CASES ENTER 1 TO 250 IN ()

ENTER FOR SENSITIVITY ANALYSIS:
  STAT. VAR. CENSORING AT PERF. FUNC. VALUE ===> 0.0  PERCENT
    DEFAULT 0.0 PERCENT (NO CENSORING)
  SENSITIVITY PERTURBATION DIRECTION ===> D
  DIRECTIONS: D BOTH (DEFAULT): P POSITIVE; N NEGATIVE

ENTER PROCESS    PF3 PREVIOUS PANEL     PF4 END

FIG. 6D
ESCAPE FINAL SUCCESS PANEL

```
                    ESCAPE

ALL ESCAPE INPUT DATA HAS BEEN
         SUCSESSFULLY READ

ESCAPE DATASET:
       USERID.CSEF.ESCOPT

WILL BE USED TO DRIVE AS/X

TO SUBMIT JOB:

ENTER AS/X CIRCUIT ANALYSIS AND ENTER
       ESCAPE IN THE CIRCUIT SIMULATION OPTIONS

PF4 END               PF3 PREVIOUS PANEL
```

FIG. 6E
PERFORMANCE FUNCTION NAME SELECTION PANEL

```
            SELECT PERFORMANCE FUNCTIONS

COMMAND ===>

ENTER PERFORMANCE FUNCTION NAMES:

===> PTONDIN
    ===> PTOFFDIN
    ===>
    ===>
    ===>
    ===>
    ===>
    ===>
    ===>
    ===>

ENTER PROCESS      PF3 PREVIOUS PANEL     PF4 END
```

FIG. 6F
INITIAL STATISTICAL VARIABLE NAME SELECTION PANEL

```
         SELECT STATISTICAL VARIABLES
    COMMAND ===>

SELECT OPTION ===> 1  (CHOOSE ONE OPTION)
      1 SELECT SPECIFIC STATISTICAL VARIABLE NAMES (1-30)
      2 SELECT GROUPS OF STATISTICAL VARIABLES AT SPECIFIED MODEL NESTING LEVELS
      3 THE NAMES OF STATISTICAL VARIABLES ARE IN THE ESCSVN DATASET

ENTER PROCESS       PF3 PREVIOUS PANEL      PF4 END
```

FIG. 7
EXAMPLE OF A CHAIN OF 4 "AND INVERT" LOGIC CIRCUIT
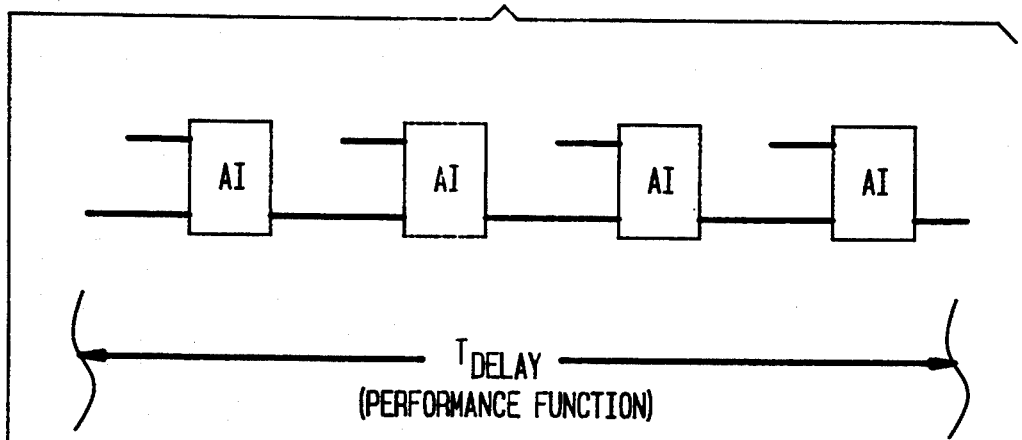
$T_{DELAY}$
(PERFORMANCE FUNCTION)
CIRCUIT DESIGNERS INTERESTED IN:
STATISTICAL VARIATION OF CRITICAL
PATHS (TIMING CONSTRAINTS)
TAILS OF DISTRIBUTIONS
($\mu+3\sigma$)
(OUTLIERS)
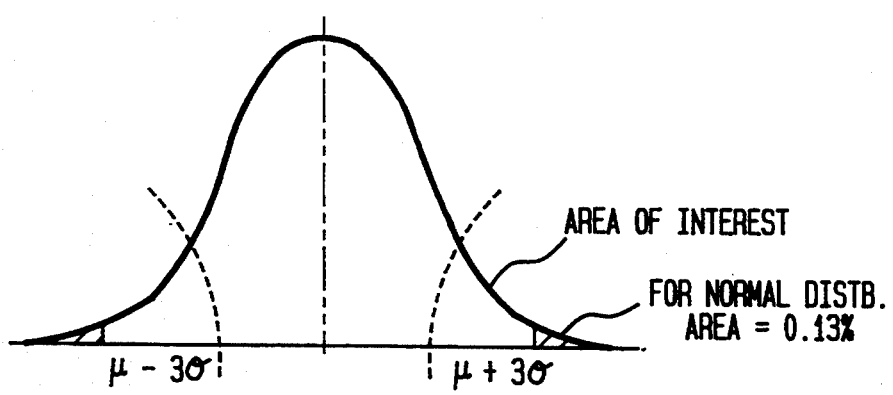
AREA OF INTEREST
FOR NORMAL DISTB.
AREA = 0.13%
$\mu - 3\sigma$  $\mu + 3\sigma$

FIG. 8
ESTIMATED DISTRIBUTION USING 2000 CASES

| NUMBER OF CASES | CUMUL PROB | RANDOM SEED | OUTPUT VALUE | 2000 CASES MIN TO MAX INTERVAL COVERS 100.00 PER CENT OF POPULATION |
|---|---|---|---|---|
| 0 | 0.0000 | | 0.2800 | x |
| 2 | 0.0010 | 1311637728 | 0.2839 | x |
| 1 | 0.0015 | 1692040540 | 0.2878 | x |
| 2 | 0.0025 | 1920853928 | 0.2917 | xx |
| 3 | 0.0040 | 1937626882 | 0.2956 | xxx |
| 5 | 0.0065 | 666122242 | 0.2995 | xxxx |
| 10 | 0.0115 | 1694255538 | 0.3034 | xxx |
| 8 | 0.0155 | 147052254 | 0.3073 | x\xxxxxxxx |
| 19 | 0.0250 | 758786595 | 0.3112 | x\xxxxxx |
| 17 | 0.0335 | 439338724 | 0.3151 | xx\xxxxxxxx |
| 23 | 0.0450 | 783116164 | 0.3190 | xxx\xxxxxxxxxxxxx |
| 38 | 0.0640 | 798503917 | 0.3229 | xxxx\xxxxxxxxxx |
| 35 | 0.0815 | 637870498 | 0.3268 | xxxxx\xxxxxxxxx |
| 40 | 0.1015 | 479856119 | 0.3307 | xxxxxxx\xxxxxxxxxxxxYxxx |
| 55 | 0.1290 | 1364428494 | 0.3346 | xxxxxxxx\xxxxxxxxxxxxYxxxx |
| 62 | 0.1600 | 1408794298 | 0.3385 | xxxxxxxxx\xxxxxxxxxxxxYxxx |
| 59 | 0.1895 | 111111 | 0.3424 | xxxxxxxxx\xxxxxxxxxxxxYxxxxx |
| 62 | 0.2205 | 1054747385 | 0.3463 | xxxxxxxxxxx\xxxxxxxxxxxYxxxxxxx |
| 81 | 0.2610 | 2015809506 | 0.3502 | xxxxxxxxxxxxx\xxxxxxYxxxxxxxxxxxxx |
| 95 | 0.3085 | 1045979870 | 0.3541 | xxxxxxxxxxxxxxx\xxxxYxxxxxxxxxxxxxxxx |
| 111 | 0.3640 | 545018096 | 0.3580 | xxxxxxxxxxxxxxxxx\xxxYxxxxxxxxxxxxxxxx |
| 104 | 0.4160 | 239307790 | 0.3619 | xxxxxxxxxxxxxxxxxxx\xxxxxxxxxxxxxxxxx |
| 113 | 0.4725 | 2010522237 | 0.3658 | xxxxxxxxxxxxxxxxxxxxx\xxxxxxxxxxxxxxx |
| 114 | 0.5295 | 1051142417 | 0.3697 | xxxxxxxxxxxxxxxxxxxxxxxY\xxxxxxxxxx |
| 120 | 0.5895 | 137842835 | 0.3736 | xxxxxxxxxxxxxxxxxxxxxxxxxxYxxx\xxxxxxxxxx |
| 111 | 0.6450 | 493259533 | 0.3775 | xxxxxxxxxxxxxxxxxxxxxxxxxxxYxxxx\xxxxxxx |
| 98 | 0.6940 | 688627698 | 0.3814 | xxxxxxxxxxxxxxxxxxxxxxxxxxxxxYxxxxxx\ |
| 93 | 0.7405 | 1504011555 | 0.3853 | xxxxxxxxxxxxxxxxxxxxxxxxxxxxxxYxxxxx |
| 93 | 0.7870 | 35358305 | 0.3892 | xxxxxxxxxxxxxxxxxxxxxxxxxxxxxxxYxxx |
| 63 | 0.8185 | 1323528776 | 0.3931 | xxxxxxxxxxxxxxxxxxxxxxxxxxxxx |
| 66 | 0.8515 | 1762248812 | 0.3970 | xxxxxxxxxxxxxxxxxxxxxxxxxxxxxx |
| 61 | 0.8820 | 648747813 | 0.4009 | xxxxxxxxxxxxxxxxxxxxxxxxxx |
| 63 | 0.9135 | 844983828 | 0.4048 | xxxxxxxxxxxxxxxxxxxxxxxxxxx |
| 35 | 0.9310 | 804080290 | 0.4087 | xxxxxxxxxxxxxxx |
| 35 | 0.9485 | 1198543283 | 0.4126 | xxxxxxxxxxxxxxxx |
| 21 | 0.9590 | 379964852 | 0.4165 | xxxxxxxxxx |
| 17 | 0.9675 | 791293650 | 0.4204 | xxxxxxxx |
| 21 | 0.9780 | 402875284 | 0.4243 | xxxxxxxxxx |
| 16 | 0.9860 | 1480905015 | 0.4282 | xxxxxxx |
| 5 | 0.9885 | 2060360979 | 0.4321 | xxx |
| 7 | 0.9920 | 563210997 | 0.4360 | xxx |
| 7 | 0.9955 | 510612768 | 0.4399 | xxx |
| 1 | 0.9960 | 690414360 | 0.4438 | x |
| 4 | 0.9980 | 284256011 | 0.4477 | xx |
| 1 | 0.9985 | 287562449 | 0.4516 | x |
| 1 | 0.9990 | 1958638523 | 0.4555 | x |
| 1 | 0.9995 | 2001989843 | 0.4594 | x |
| 0 | 0.9995 | | 0.4633 | |
| 0 | 0.9995 | | 0.4672 | |
| 1 | 1.0000 | 1197711222 | 0.4711 | x |
| 0 | 1.0000 | | 0.4750 | |

CUM. DIST

RANDOM NUMBER SEED- ESTIMATE 0.5% TAIL (10 CASES)

FIG. 9
TRUE TAIL DISTRIBUTION FOR 10 CASES

PERF FUNCTION AT + TAIL AREA 0.13% = .46348
MINIMUM = .438  MAXIMUM = .478
MAX. | DELTA | DIFFERENCE = .01363
CORRELATION COEFFICIENT BETWEEN EST. AND
 TRUE TAIL = .927

| NUMBER | CUMUL | RANDOM | OUTPUT | |
|---|---|---|---|---|
| 0 | 0.0000 | | 0.4350 | |
| 0 | 0.0000 | | 0.4359 | |
| 0 | 0.0000 | | 0.4368 | |
| 1 | 0.1000 | 690414360 | 0.4377 | ××××××X×××××××××××××××××××××××××××××××× |
| 0 | 0.1000 | | 0.4386 | X |
| 0 | 0.1000 | | 0.4395 | X |
| 0 | 0.1000 | | 0.4404 | X |
| 0 | 0.1000 | | 0.4413 | X |
| 0 | 0.1000 | | 0.4422 | X |
| 1 | 0.2000 | 2030740837 | 0.4431 | ×××××××××××X×××××××××××××××××××××××××× |
| 0 | 0.2000 | | 0.4440 | X |
| 1 | 0.3000 | 708280236 | 0.4449 | ××××××××××××××X×××××××××××××××××××××× |
| 0 | 0.3000 | | 0.4458 | X |
| 0 | 0.3000 | | 0.4467 | X |
| 1 | 0.4000 | 1618507844 | 0.4476 | ××××××××××××××××××X××××××××××××××××× |
| 1 | 0.5000 | 284256011 | 0.4485 | ×××××××××××××××××××××××X××××××××××× |
| 0 | 0.5000 | | 0.4494 | |
| 0 | 0.5000 | | 0.4503 | |
| 0 | 0.5000 | | 0.4512 | |
| 1 | 0.6000 | 287562449 | 0.4521 | ××××××××××××××××××××××××××××××X×××× |
| 0 | 0.6000 | | 0.4530 | X |
| 0 | 0.6000 | | 0.4539 | X |
| 0 | 0.6000 | | 0.4548 | X |
| 0 | 0.6000 | | 0.4557 | X |
| 0 | 0.6000 | | 0.4566 | X |
| 0 | 0.6000 | | 0.4575 | X |
| 0 | 0.6000 | | 0.4584 | X |
| 0 | 0.6000 | | 0.4593 | X |
| 1 | 0.7000 | 1438091893 | 0.4602 | ×××××××××××××××××××××××××××××××××××X×××× |
| 0 | 0.7000 | | 0.4611 | X |
| 0 | 0.7000 | RNS T | 0.4620 | X |
| 0 | 0.7000 | | 0.4629 | X |
| 1 | 0.8000 | 958638523 | 0.4638 | ××××××××××××××××××××××××××××××××××××××X×× |
| 0 | 0.8000 | | 0.4647 | X |
| 0 | 0.8000 | | 0.4656 | X |
| 0 | 0.8000 | | 0.4665 | X |
| 0 | 0.8000 | | 0.4674 | X |
| 0 | 0.8000 | | 0.4683 | X |
| 0 | 0.8000 | | 0.4692 | X |
| 0 | 0.8000 | | 0.4701 | X |
| 0 | 0.8000 | | 0.4710 | X |
| 0 | 0.8000 | | 0.4719 | X |
| 0 | 0.8000 | | 0.4728 | X |
| 0 | 0.8000 | MAX. DELTA | 0.4737 | X |
| 1 | 0.9000 | 2001989843 | 0.4746 | ×××××××××××××××××××××××××××××××××××××××× |
| 0 | 0.9000 | | 0.4755 | |
| 0 | 0.9000 | | 0.4764 | |
| 0 | 0.9000 | | 0.4773 | |
| 1 | 1.0000 | 1197711222 | 0.4782 | ×××××××××××××××××××××××××××××××××××××××× |
| 0 | 1.0000 | | 0.4791 | |
| 0 | 1.0000 | | 0.4800 | |

SCATTERGRAM OF ESTIMATED VS TRUE DISTRIBUTION

CIRCUIT DESIGN METHOD AND SYSTEM THEREFOR

FIELD OF THE INVENTION

The present invention relates to electrical circuit design and in particular to computer aided electrical circuit design.

BACKGROUND OF THE INVENTION

All designs including electrical circuit designs can be described by operational characteristics called performance functions or PFs. When a design is made into a hardware, it acquires some variability based on the manufacturing parameter fluctuations. The design is considered good when the design functional value or the characteristics varies, within a set limit under these manufacturing fluctuations. Hence circuits are designed for manufacturing fluctuations of the parameters. When these manufacturing parameters are within an accepted range, the design must function according to specifications. Design specifications are sometimes called design objectives. While these manufacturing parameters are generally independent of each other, the circuit PF is usually dependent upon all of them. The variability of a parameter or PF can be specified by a statistical quantity sigma, which is the standard deviation of all values from the median. For example, referring to FIG. 1A, a hypothetical distribution of a variable, which in the present case can be a physical parameter or a circuit performance function, has been shown with a single peak or maximum. The extreme value region of the distribution is called the tail. FIG. 1B shows a magnification of the tail region of FIG. 1A. The subscript E denotes an estimated value, while T denotes a true value (may be obtained by simulation). For the case of a normal distribution, shown in FIG. 1A, the variable is distributed in a bell-shaped curve around its mean value. In this case, a specification of mean ±3 sigma means that 99.87 percent of all the circuits (designs) built will have the PF within the specified range. Conversely the number of circuits that are outside the specification will be 0.0013 cases or approximately 1 in a thousand. To accurately determine the tail portion outside of the mean + or −3 sigma, requires determining 1000 cases, so that at least one PF of the distribution will be in the tail region. This is referred to as worst-case analysis.

An electrical circuit used in very large scale integration application such as computers, has several important performance functions that are of interest to the designer. Some of these functions are circuit speed or signal delay, signal gain, noise etc. The circuit is usually defined by the values of its constituent devices, such as resistances, capacitances, inductances, power supply currents, voltages, transistor gains etc. which determine PFs. It is these elements that results from the manufacturing parameters. For example, the value of a silicon resistor is determined by its physical dimensions and the electrical sheet resistivity of the silicon. The sheet resistivity in turn is affected by the concentration and distribution of dopants (impurities) added to the silicon. Variations in the physical dimensions or the dopant concentration lead to a variation of the resistor value. Similarly, a Field Effect Transistor (FET), has parameters such as channel length, channel width, gate oxide thickness, mobility, and effective charge, etc. These parameters determine the FETs functional characteristics. Thus it is seen that the variability in circuit performance as described by its PF can be derived from the variabilities of several parameters.

In order to construct the variations of a performance function, the circuit needs to be analyzed at various combinations of parameter values. Depending on the number of parameters of the circuit, the complexity of the circuit, simulating a circuit for analysis takes up large computing time and hence is expensive. Some of the well known circuit simulation programs are Advanced Statistical and Transient Analysis Program (ASTAP), Circuit Simulator for IC Circuits (SPICE), and Statistical Simulator for IC Fabrication (FABRICS II). These are used to simulate the circuits, devices and processes. Depending on the complexity of the device or circuit, these simulations require large computers and use significant CPU times.

Another aspect of determining the distribution curve is the selection of the parameters for each simulation. In the Monte-Carlo technique, the calculation values used in simulation are totally random combinations of parameter values. Other techniques use different ways to select the combination of parameter values for simulation. Nassif, et al. compares the worst case analysis results using Monte-Carlo techniques with results from use of process disturbances in conjunction with the Fabrics-II simulator (S.R. Nassif, et al., "Fabrics II - A Statistical Simulator of the IC Fabrication Process", Proceedings of International Conference on Circuits and Computers, IEEE, New York, September 1982). F. Severson and S. Simpkins, Custom Integrated Circuit Conference, pp. 114-8, IEEE 1987, discloses a technique that uses Hadamard matrix analysis in conjunction with SPICE to determine worst case values. These techniques use circuit simulation and only differ in how the parameters are picked for analysis. Thus these prior art techniques are extremely expensive for highly complex designs. Although, they accurately determine the entire distribution curve using circuit simulation, the designer is really interested in the tail values. To this extent, a large fraction of their computing effort is wasted as the tail values usually represent only 1 percent or less of the total distribution.

OBJECTS OF THE INVENTION

It is an object of the present invention to improve circuit design.

It is another object of the present invention to reduce the cost of circuit design.

It is still another object of the present invention to reduce circuit design time.

It is yet another object of the present invention is to improve circuit design at reduced cost and time.

SUMMARY OF THE INVENTION

The present invention is a method of circuit design. First, the sensitivity of a circuit performance function (Sensitivity Data Set - SDS) to at least one physical parameter is determined. Then, an estimated distribution of the design function is calculated by using the SDS and random parameter values. Subsequently, the parameters corresponding to the estimated distribution is used to calculate the tail. The calculated tail is compared to a predetermined design objective. If the objective is not met, the design is modified and the calculation steps repeated until the design objective is met.

BRIEF DESCRIPTION OF THE DRAWINGS

The objects, features and advantages of the invention will be apparent from the following more particular description of the invention illustrated in the accompanying drawings, in which:

FIG. 4 is a comparison of the present invention for a circuit analyzed with prior art Monte-Carlo analysis method.

FIGS. 6A-F illustrates the interactive display panels for a system according to the preferred embodiment of the present invention.

FIG. 7 shows an example of a logic circuit analyzed according to the preferred embodiments of the present invention.

FIG. 8 shows an estimated distribution of a selected circuit analyzed according to the preferred embodiments of the present invention.

FIG. 9 shows the true tail distribution of the selected circuit of FIG. 8.

DETAILED DESCRIPTION OF THE INVENTION

Figure 1A:
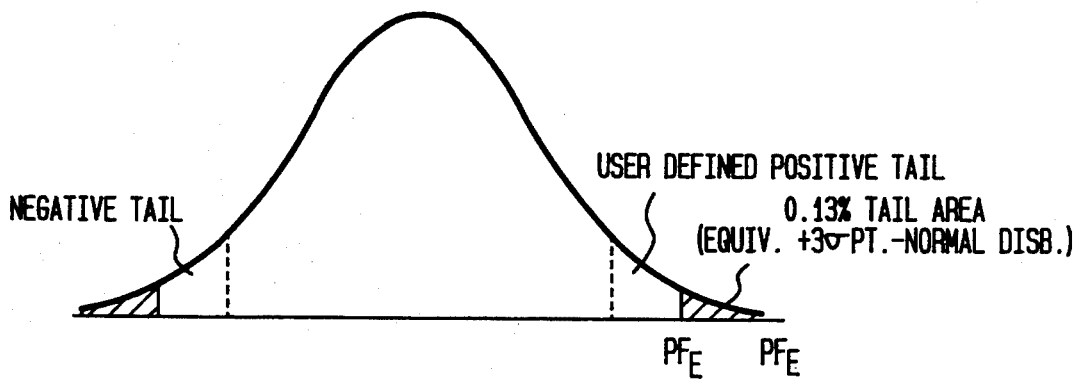
FIG. 1A and 1B shows a typical design distribution.
Figure 1B:
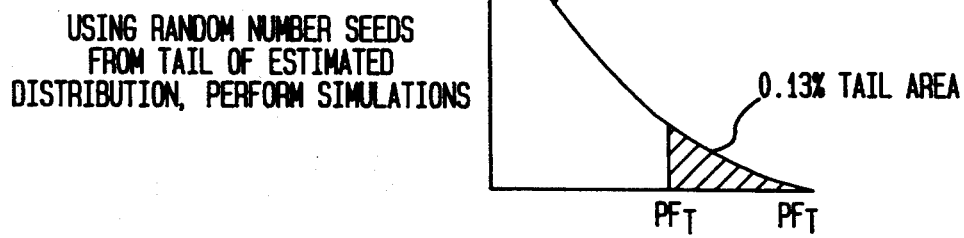
Figure 2:
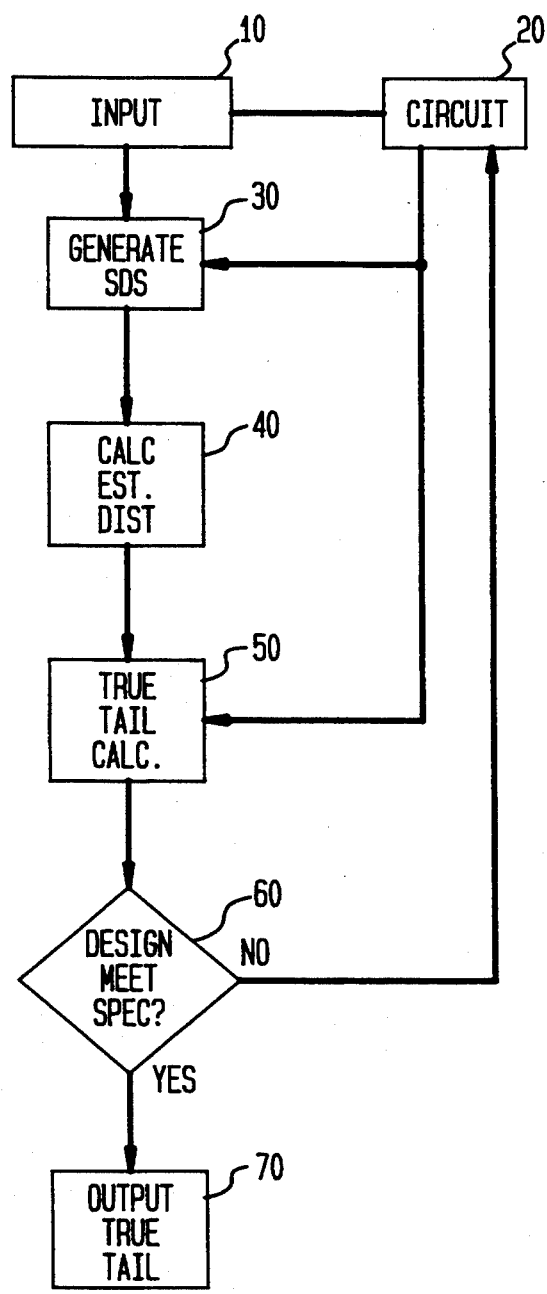
FIG. 2 is a flowchart of the steps of the preferred embodiments of the present invention.

FIG. 2 is a flow diagram of a preferred embodiment of the present invention. The INPUT 10 step involves entering design data, design parameters, extreme values of the design parameters and information on performance function, design specification and specification of the tail area of interest. The CIRCUIT 20 step is the description of the circuit. In GENERATE SDS 30 step, the circuit sensitivity for each of the performance function to the physical parameter of interest is determined. The PF values are determined by circuit simulation at the following parameter values: all parameters at their average value and each parameter varied to its extreme high and low value individually, while keeping the rest of the parameters at their average value. If there are n variables, then the circuit simulation is used $2n+1$ times for each design performance function to determine the SDS values. Next, the circuit performance sensitivity to a parameter between its average and extreme value is approximated by the slope of the line connecting the calculated PF value at the extreme and average parameter values. Accordingly, there will be $2n$ SDS values for each performance function. Any of the available circuit simulation programs such as ASTAP, SPICE, etc., can be used for simulation.

Referring again to FIG. 2, CALC EST. DIST 40 step determines the estimated distribution of the design PFs by evaluating them at the specified total number of cases required by the tail specification. The number of cases for analysis is specified at the INPUT 10 step. The default for the number of cases analyzed is set at 2000, however it can be set to any desired value. The tail can be specified by the fractional area, such as 0.5% of the total area or by the number of tail cases desired. The tail specification must correspond to the design specification. For example, if the design range is specified to be a 3 sigma design, then the tail is a 3 sigma tail. A random generator is used to determine a random parameter value for each case at the step EST.DIST 40, at which the PF is calculated to establish the estimated distribution curve. The PF computing time is minimized by using the SDS values calculated earlier and the random variables for each case in the equation below:

$$PF = f(p_1, p_2, \ldots, p_n) = f_{nom} + \sum_{i=1}^{n} m_i (p_i - \bar{p}_i)$$

wherein $$m_i = \frac{f_{nom} - f(p_{imin,max})}{\bar{p}_i - p_{imin,max}} \text{ and,}$$

$$f_{nom} = f(\bar{p}_i, \bar{p}_2, \ldots, \bar{p}_n)$$

and $p_i$ is the random parameter value, $\bar{p}_i$ is the nominal parameter value.

Figure 3:
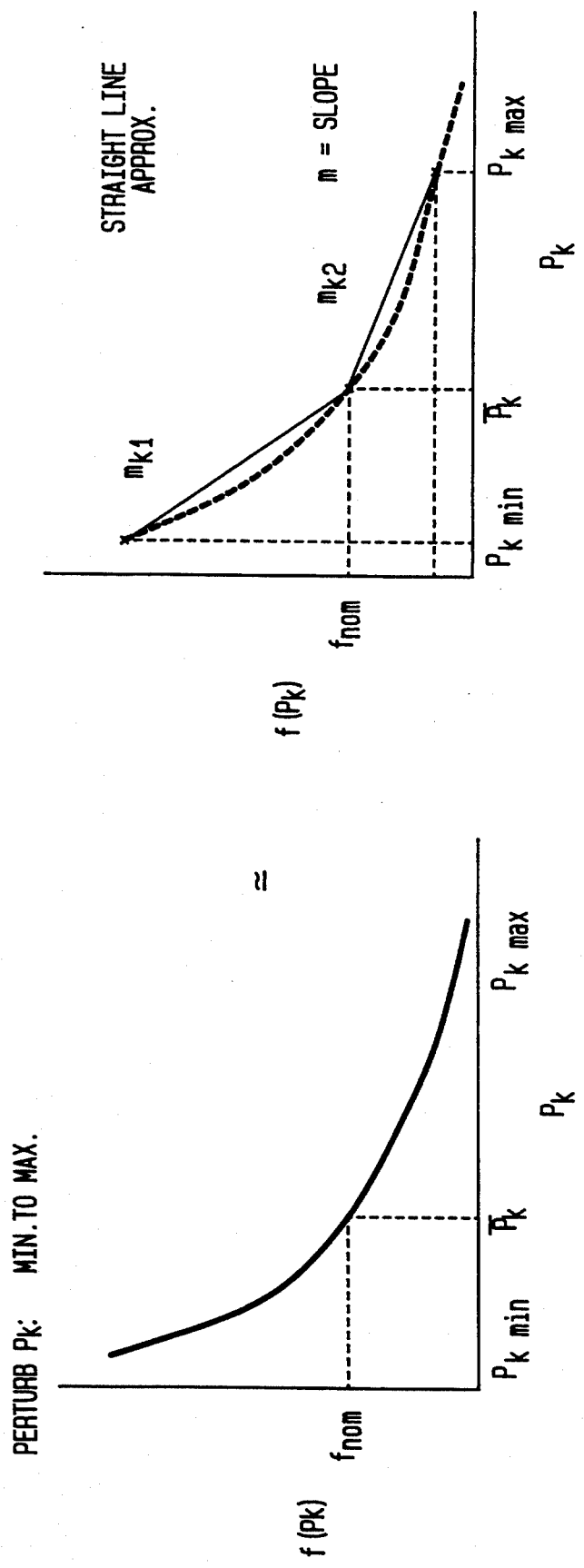
FIG. 3 graphically illustrates the design performance sensitivity approximation used in this invention.

The above equation is obtained by expanding the PF function with n parameters into a Taylor series. The cross derivatives and higher order derivative terms are neglected. The first order derivative is approximated by m's defined above. This approximation is illustrated in FIG. 3. It is clear from FIG. 3 that the slope is different from the derivative at the extreme or nominal values.

Referring once again to FIG. 2, in the TRUE TAIL CALC 50 step, the random parameter values corresponding to the PF value from the estimated distribution tail is retrieved. These retrieved parameter values are used to accurately construct a new tail for the PF, referred to as true tail. The true tail boundary value for the PF is compared to the design specification (also referred to as design objective) for the same PF in the DESIGN MEET SPEC 60 step. If the comparison is unfavorable, then the circuit is modified in CIRCUIT 20 and steps 30 to 60 are repeated. If, however, the comparison is favorable, then the actual values of the true tail are reported. The design is complete.

If for example, a circuit has 100 variables and there are 10 points in the tail region of interest, according to the present invention the circuit must be simulated 211 times (201 times for the SDS values and 10 times for the tail) instead of 1000 times by the prior art methods. Since the design will have several performance functions and may require several passes, the present invention provides a significant time and cost savings. Further savings can be achieved by selectively limiting parameters varied. FIG. 4 shows a comparison for the example case where only 23 out of 99 parameters were selected.

Figure 5:
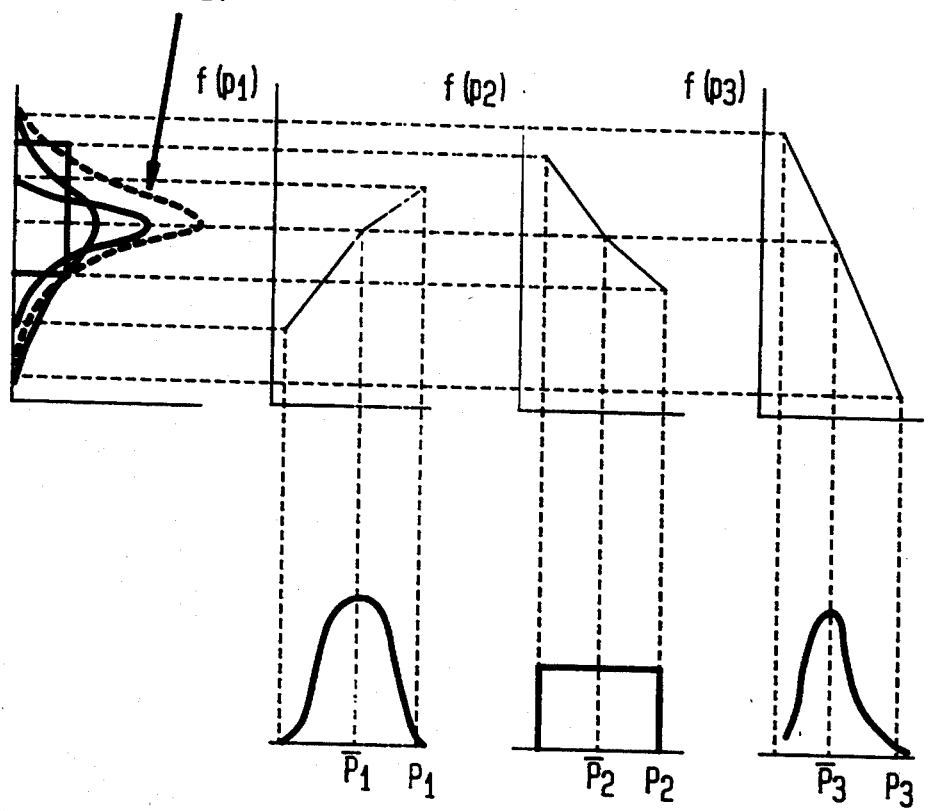
FIG. 5 graphically illustrates the generation of estimated distribution for three statistical variables from the circuit sensitivity.

FIG. 5, a graphical construction of an estimated distribution using three statistical variables p1, p2 and p3. These variables have their own unique distribution, and the performance function sensitivity of each variable f(p1), f(p2) and f(p3) is approximated by a linear curve. The estimated distribution is obtained by the method of summing the product of $m_i$ and the parameter value difference from their nominal value.

EXAMPLE 1

FIGS. 6A-F is an example of a menu driven, interactive system according to the preferred embodiments of the present invention. This system includes a variety of display panels which prompt the designer to select the required analysis and allows the designer to describe the structure of the circuit and for inputting and selecting other parameters.

FIG. 6A is the ESCAPE initial selection panel. The user selects options from among possible operations and inputs the name of the circuit data set. If option one is selected, then the system provides the panel shown in FIG. 6B (the ESCAPE main options panel) to the designer for selecting the type of circuit analysis and thus the type of output. Further, the designer can select other inputs such as the tail or the number of cases for the histogram. Next, as shown in FIG. 6C, the designer selects the tail failure criteria, which may be an "n" sigma design (where n ranges from 3 to 6). When all necessary inputs have been provided, the success panel in FIG. 6D is displayed. If options one, two or five in FIG. 6B had been selected, after selecting the tail fail criteria (FIG. 6C), the designer selects the PF names in FIG. 6E. Then the designer uses one of three different techniques to select statistical parameters as in FIG. 6F.

EXAMPLE 2

The second example is the design of the chain of 4 AND INVERT (AI) logic circuit shown in FIG. 7 for the delay (the rise and fall) performance function. A total of 99 parameters were identified. The tail area was specified to be 0.5%.

FIG. 8 shows the final result of the estimated distribution (histogram and cumulative distribution). The calculated specified tail region has been highlighted by a box in the figure. The number of cases calculated were 2000 and, therefore, the number of cases in the tail area specified is ten, which has been marked. Also shown in FIG. 8 is the random seed numbers corresponding to the tail area. It should be understood that had the calculated true tail not been within a predetermined range, the AI's would be modified until that objective (predetermined range) was met.

As shown in FIG. 9, the tail region has the true PF values obtained by circuit simulation using the random number seeds obtained from the tail of the estimated distribution. The table provides some comparisons between the true PF and estimated PF values of the tail region. The true and estimated tails correlate well with a correlation coefficient of 0.927, where 1 means equivalence.

Figure 10:
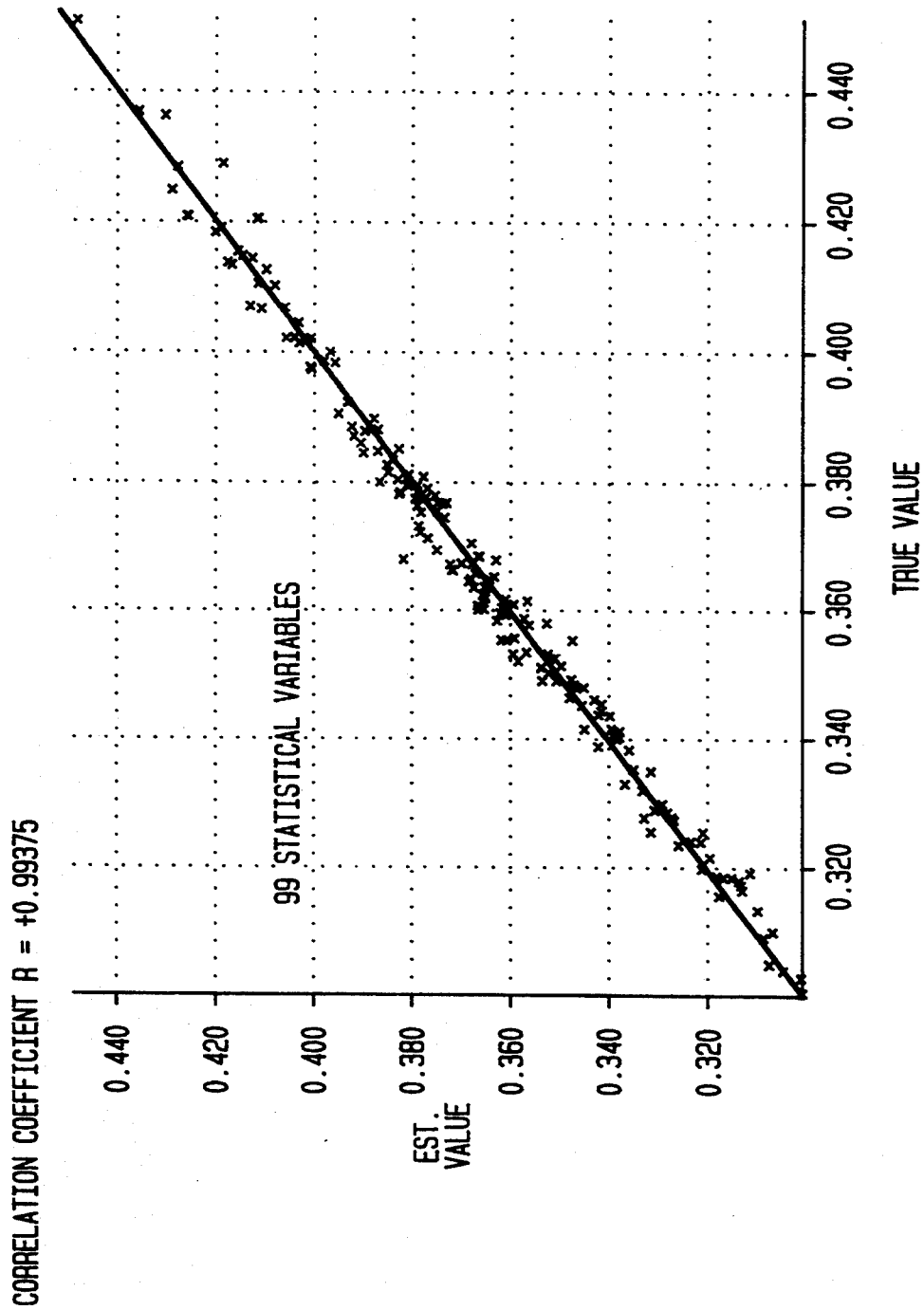
FIG. 10 shows the correlation between estimated distribution and true distribution according to the preferred embodiments of the present invention.

FIG. 10 is a plot of calculated values by the present invention compared to Monte Carlo method (scattergram) for the performance function of FIG. 9. In this case, the correlation coefficient between the estimated and true values is 0.993.

Again referring back to FIG. 4, the results of the AI circuit for 7 different performance functions between Monte Carlo and the present invention with only 23 significant parameters out of the total 99, shows that satisfactory analysis can be achieved using the present invention, while saving computing time further.

The present invention has been described in terms of circuit design. However, the concept of the present invention is equally applicable to other designs such as for mechanical systems, thermal systems and structures. Every design has certain operational characteristics or performance functions and design objectives or specification. To illustrate this generality, consider a mechanical design of an engine wherein the power output is a PF. The parameters that affect this PF are compression ratios, bore diameters, etc., which vary in a manufacturing process. The method of calculating the variability of engine power and modifying design if needed is identical to that used for circuit design.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A design method comprising:
   a) calculating a design function sensitivity for at least one physical parameter of a structure, said design function sensitivity calculation comprising the steps of:
      i) calculating a plurality of design functional characteristic values with one said physical parameter at an extreme value, the rest of said plurality of parameters being held at average values, and,
      ii) determining a line slope of an imaginary line for each said design function between the average and extreme value of said design characteristic;
   b) determining an estimated distribution of said design functional characteristics from said design functional sensitivity;
   c) calculating a pair of tail values for each of said design functional characteristics;
   d) determining whether said calculated pair of tail values meet a predetermined set of design objectives;
   e) modifying said structure, unless said design objectives are met; and
   f) repeating steps a–e above until said design objectives are met.

2. The design method of claim 1, wherein said design is an electrical design.

* * * * *